United States Patent
Yoshinari

(10) Patent No.: US 9,034,708 B2
(45) Date of Patent: May 19, 2015

(54) SEMICONDUCTOR DEVICE FABRICATION METHOD AND SEMICONDUCTOR DEVICE

(71) Applicant: LAPIS SEMICONDUCTOR CO., LTD., Kanagawa (JP)

(72) Inventor: Masataka Yoshinari, Miyazaki (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 14/101,373

(22) Filed: Dec. 10, 2013

(65) Prior Publication Data

US 2014/0175620 A1 Jun. 26, 2014

(30) Foreign Application Priority Data

Dec. 21, 2012 (JP) .................... 2012-280071

(51) Int. Cl.
| | |
|---|---|
| H01L 21/304 | (2006.01) |
| H01L 21/306 | (2006.01) |
| H01L 29/36 | (2006.01) |
| H01L 29/66 | (2006.01) |
| H01L 29/739 | (2006.01) |
| H01L 21/02 | (2006.01) |
| H01L 21/265 | (2006.01) |
| H01L 21/268 | (2006.01) |

(52) U.S. Cl.
CPC ............ *H01L 29/36* (2013.01); *H01L 21/02016* (2013.01); *H01L 21/304* (2013.01); *H01L 21/306* (2013.01); *H01L 21/26513* (2013.01); *H01L 21/268* (2013.01); *H01L 29/66348* (2013.01); *H01L 29/7397* (2013.01); *Y10S 438/977* (2013.01)

(58) Field of Classification Search
CPC ............ H01L 21/02016; H01L 21/304; H01L 21/306
USPC .......................... 438/268, 691, 977
See application file for complete search history.

(56) References Cited

U.S. PATENT DOCUMENTS

| | | | | | |
|---|---|---|---|---|---|
| 4,410,395 | A | * | 10/1983 | Weaver et al. | 438/471 |
| 5,605,602 | A | * | 2/1997 | DeBusk | 438/476 |
| 5,739,067 | A | * | 4/1998 | DeBusk et al. | 438/618 |
| 2005/0221563 | A1 | * | 10/2005 | Baiocchi et al. | 438/268 |
| 2010/0062611 | A1 | * | 3/2010 | Liu et al. | 438/747 |
| 2012/0149145 | A1 | * | 6/2012 | Yang et al. | 438/87 |

FOREIGN PATENT DOCUMENTS

| | | |
|---|---|---|
| JP | 2011-151350 A | 8/2011 |
| JP | 2011-204716 | 10/2011 |
| JP | 2012-174956 A | 9/2012 |

* cited by examiner

*Primary Examiner* — George Fourson, III
(74) *Attorney, Agent, or Firm* — Volentine & Whitt, PLLC

(57) ABSTRACT

There is provided a method of fabricating a semiconductor device, the method including: forming a first semiconductor region at a front surface of a substrate, the first semiconductor region including an active element that regulates current flowing in a thickness direction of the substrate; grinding a rear surface of the substrate; after the grinding, performing a first etching that etches the rear surface of the substrate with a chemical solution including phosphorus; after the first etching, performing a second etching that etches the rear surface with an etching method with a lower etching rate than the first etching; and after the second etching, forming a second semiconductor region through which the current is to flow, by implanting impurities from the rear surface of the substrate.

6 Claims, 7 Drawing Sheets

SEMICONDUCTOR DEVICE FABRICATION METHOD AND SEMICONDUCTOR DEVICE

CROSS-REFERENCE TO RELATED APPLICATION

This application is based on and claims priority under 35 USC 119 from Japanese Patent Application No. 2012-280071 filed on Dec. 21, 2012, the disclosure of which is incorporated by reference herein.

BACKGROUND

1. Technical Field

The present invention relates to a semiconductor device fabrication method and a semiconductor device.

2. Related Art

In a power semiconductor device in which current flows in a thickness direction of a semiconductor wafer (substrate)—such as an insulated gate bipolar transistor (IGBT), a metal oxide semiconductor field effect transistor (MOSFET), a diode or the like—that is, a power semiconductor device with an electrode at a rear surface of the semiconductor substrate, an inherent resistance component due to the thickness of the semiconductor substrate cannot be disregarded. Accordingly, to avoid deterioration in on-characteristics or off-characteristics of the semiconductor device due to the thickness of the semiconductor substrate, the application of thinning processing to the semiconductor substrate, to make the thickness of the semiconductor substrate thinner, is needed.

Japanese Patent Application Laid-Open (JP-A) No. 2012-174956 discloses a technology in which, in thinning processing of the semiconductor substrate of a power semiconductor device such as an IGBT or the like, mechanical grinding is applied by backgrinding or the like to the rear surface of the semiconductor substrate, at which a front surface structure has been formed, and then chemical grinding such as wet etching or the like is applied in order to remove machining stresses introduced by the mechanical grinding.

JP-A No. 2011-151350 discloses a technology in which a mixed chemical solution of hydrofluoric acid, nitric acid, sulfuric acid and phosphoric acid is used as a chemical solution for grinding by wet etching of the rear surface of a silicon substrate, after a front face structure has been formed.

JP-A No. 2011-204716 discloses a technology in which, in a process of fabrication of a trench gate-type IGBT, boron is implanted into the rear surface of a semiconductor substrate at which a front face structure has been formed, and then the implanted boron is activated by laser annealing.

In the related art as described above, a technology of forming a front face structure and then grinding the rear surface of a semiconductor substrate, a technology of wet etching a rear surface in order to remove a layer damaged by rear surface grinding, and a technology of laser annealing to activate impurities implanted at a rear surface have been respectively partially disclosed.

The rear surface grinding disclosed in JP-A No. 2012-174956 is a basic technology of thinning processing for reducing the resistance of a semiconductor substrate. Meanwhile, rear surface wet etching is a technology that removes a damaged layer of a semiconductor substrate caused by mechanical grinding such as backgrinding or the like, and is required, for example, to prevent cracking of the semiconductor substrate in conveyance operations subsequent to the thinning processing.

With the mixed chemical solution for wet etching disclosed in JP-A No. 2011-151350, the etching progresses by the nitric acid ($HNO_3$) oxidizing the silicon substrate and the hydrofluoric acid (HF) removing the silicon oxide. The phosphoric acid ($H_3PO_4$) in the mixed chemical solution has the effect of self-consistently (anisotropically) reducing surface irregularities of the silicon substrate, and is effective for increasing the strength of the silicon substrate.

That is, the phosphoric acid pools in indented portions of the irregularities caused by mechanical grinding or the like, reduces the etching rate (etching speed) of the indented portions, and produces a difference from the etching rate of projecting portions. Thus, the phosphoric acid may produce a smooth mirror finish.

Hence, a silicon substrate rear surface with a mirror finish is in an ideal state for the formation of a rear surface metal electrode by vapor deposition, sputtering or the like.

In the activation of implanted impurities by laser annealing disclosed in JP-A No. 2011-204716, local impurity regions may be formed and a density profile may be precisely controlled. Thus, this is an important technology for facilitating the design of density profiles in order to improve the performance of semiconductor devices.

The respective steps of rear surface grinding, wet etching and laser annealing that are partially disclosed in the above-mentioned references are for solving respective problems in thinning processing of a semiconductor substrate for a power semiconductor device such as an IGBT or the like, in which current is to flow in the thickness direction of the semiconductor substrate. That is, the semiconductor substrate is reduced in thickness and lowered in resistance, measures are taken to counter a reduction in strength of the semiconductor substrate caused by the thinning, and density profile design in order to improve performance is facilitated.

Thus, a series of steps of the rear surface grinding, wet etching and laser annealing of the related art are basic steps in a semiconductor substrate thinning process.

Meanwhile, for IGBTs, further improvements in technologies that reduce a switching loss at a turn-off time (which may be denoted with the symbol "$E_{off}$" hereinafter) are required. The term "switching loss at a turn-off time" used herein is intended to include a loss due to current flowing between the emitter and the collector of an IGBT in the moment after the gate voltage is turned off.

FIG. 1 is a schematic diagram showing a relationship between a $V_{ce(sat)}$–$E_{off}$ characteristic and collector density. Here, $V_{ce(sat)}$ is the voltage between the collector and emitter in the saturation region. As shown in FIG. 1, when the collector density is lower, $V_{ce(sat)}$ rises but $E_{off}$ tends to decrease. This is thought to be because, while there is a trade-off of $V_{ce(sat)}$ rising when the collector density is lower, an effect of minority carriers becoming easier to free arises and this contributes to the decrease in $E_{off}$.

Thus, to reduce $E_{off}$, the impurity density in the collector region of an IGBT must be lowered. In particular, for a next-generation IGBT it is considered necessary to lower the $P^+$ collector density of a P-type collector to around $5 \times 10^{17}$ atoms/$cm^3$.

However, as described above, phosphoric acid is necessarily included in the chemical solution of the wet etching in the semiconductor substrate thinning process. Thus, when the rear surface wet etching has finished, phosphorus that was contained in the etching solution remains at the surface of the semiconductor substrate.

If this phosphorus is not completely removed by usual deionized water (purified water) washing and impurities are activated by laser annealing in the following stage with the phosphorus still present, the phosphorus is activated as an N-type impurity. In consequence, the density profile of the P-type collector shifts away from design values, which causes deterioration in characteristics of the semiconductor device.

As a practical example, FIG. 2 is a graph showing results of an analysis with a secondary ion-microprobe mass spectrometer (SIMS) of a silicon substrate specimen that has been wet-etched with a mixed chemical solution of hydrofluoric acid, nitric acid and phosphoric acid and, after rinse-washing with purified water, has been subjected to laser annealing.

In the example shown in FIG. 2, undesired phosphorus is detected with a density of around $2\times10^{17}$ atoms/cm$^3$ to a depth of around 0.4 μm from the rear surface of the wet-etched silicon substrate.

This indicates that the phosphorus included in the chemical solution in the wet etching step adheres to the rear surface of the silicon substrate, and that the residual phosphorus adhering to the rear surface of the silicon substrate in the wet etching step is not completely removed by the rinse-washing with purified water after the wet etching. It also indicates that the residual phosphorus adhering to the rear surface of the silicon is subsequently diffused to a depth of 0.4 μm by the laser annealing.

The phosphorus density of around $2\times10^{17}$ atoms/cm$^3$ corresponds to 40% of a target impurity density of $5\times10^{17}$ atoms/cm$^3$ (of, for example, boron $^{11}B^+$) for a P-type collector.

Because this phosphorus dispersed in the silicon substrate acts as N-type impurities, the phosphorus functions as a counter-dopant against the P-type impurities in the P-type collector of, for example, an IGBT. This leads to variations in the P-type collector density of the IGBT and disrupts precise design of impurity densities, thus hindering a reduction in $E_{off}$.

Thus, how phosphorus that adheres during wet etching can be assuredly removed is a question affecting further improvements in the characteristics of IGBTs.

SUMMARY

The present invention has been made in order to solve the problem described above, and an object of the invention is to provide a semiconductor device fabrication method that assuredly removes undesired impurities adhered to a semiconductor substrate in association with etching of the semiconductor substrate and that enables precise design of an impurity density profile of the semiconductor substrate, and a semiconductor device that is fabricated by this fabrication method.

A first aspect of the present invention provides a method of fabricating a semiconductor device, the method including:

forming a first semiconductor region at a front surface of a substrate, the first semiconductor region including an active element that regulates current flowing in a thickness direction of the substrate;

grinding a rear surface of the substrate;

after the grinding, performing a first etching that etches the rear surface of the substrate with a chemical solution including phosphorus;

after the first etching, performing a second etching that etches the rear surface with an etching method with a lower etching rate than the first etching; and after the second etching, forming a second semiconductor region through which the current is to flow, by implanting impurities from the rear surface of the substrate.

A second aspect of the present invention provides a semiconductor device including:

a substrate;

a first semiconductor region formed at a front surface of the substrate, the first semiconductor region including an active element that regulates current flowing in a thickness direction of the substrate;

an implantation region in which phosphorus is implanted such that a peak portion of density per unit volume is disposed at a predetermined distance from a rear surface of the substrate; and a second semiconductor region between the implantation region and the rear surface of the substrate, in which impurities of a predetermined conduction type are implanted, that is formed with a predetermined thickness, and through which the current flows, wherein a density per unit volume of phosphorus in the second semiconductor region is at most $\frac{1}{10}$ of a density per unit volume of the impurities of the predetermined conduction type in the second semiconductor region.

A third aspect of the present invention provides a semiconductor device including:

a substrate;

a first semiconductor region formed at a front surface of the substrate, the first semiconductor region including an active element that regulates current flowing in a thickness direction of the substrate;

an implantation region in which phosphorus is implanted such that a peak portion of density per unit volume is disposed at a predetermined distance from a rear surface of the substrate; and a second semiconductor region between the implantation region and the rear surface of the substrate, in which impurities of a predetermined conduction type are implanted and through which the current flows, wherein a density per unit volume of phosphorus in the second semiconductor region is at most $\frac{1}{5}$ of a peak density per unit volume of phosphorus in the implantation region, and a density per unit volume of the impurities of the predetermined conduction type in the second semiconductor region is at most $5\times10^{17}$ atoms/cm$^3$.

According to the present invention, a semiconductor device fabrication method that assuredly achieves the removal of undesired impurities adhered to a semiconductor substrate in association with etching of the semiconductor substrate and that enables precise design of an impurity density profile of the semiconductor substrate, and a semiconductor device that is fabricated by this fabrication method, may be provided.

BRIEF DESCRIPTION OF THE DRAWINGS

Exemplary embodiments of the present invention will be described in detail based on the following figures, wherein.

DETAILED DESCRIPTION

Figure 1:
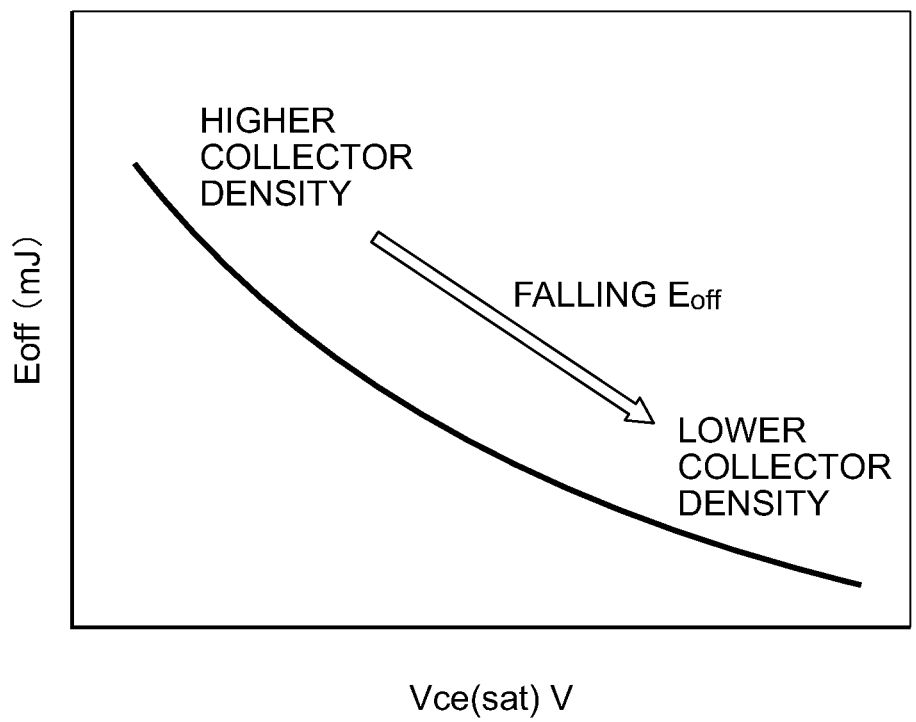
FIG. 1 is a graph showing an example of a relationship between a $V_{ce(sat)}$–$E_{off}$ characteristic of an IGBT and collector density.
Figure 2:
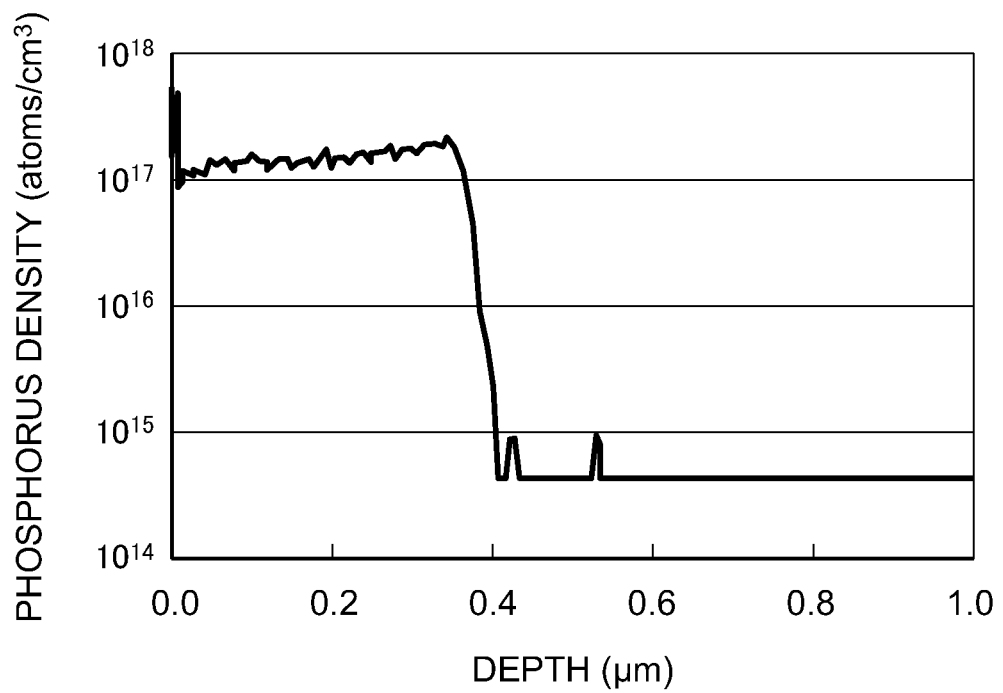
FIG. 2 is a graph showing an example of densities of phosphorus after rear surface wet etching.
Figure 3:
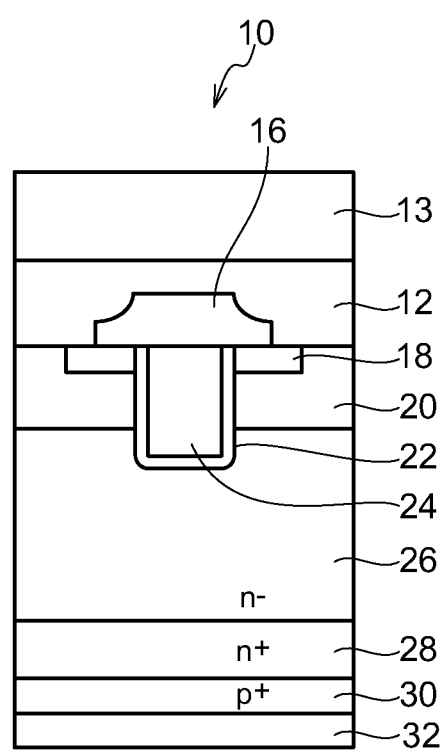
FIG. 3 is a vertical sectional diagram showing an example of a semiconductor device in accordance with an exemplary embodiment.

FIG. 3 illustrates a vertical sectional diagram of a semiconductor device 10 in accordance with an exemplary embodiment. The semiconductor device 10 is an IGBT with a trench gate architecture, which serves as an example of a semiconductor device. The semiconductor device 10 is provided with an active region (an insulated gate structure) that regulates current flowing in the thickness direction of a substrate, including a trench gate 24, a gate oxide film 22, an N-type emitter layer 18, a P-type channel layer 20, an interlayer film 16, a front surface metal electrode 12 and a protective film 13. Below the active region, an N-type substrate 26, a buffer layer (field stop (FS) layer) 28, a P-type collector layer 30 and a rear surface metal electrode 32 are provided. As an example, a silicon substrate is used as the N-type substrate 26.

In the semiconductor device 10, when a voltage is applied to the trench gate 24, electrons from the N-type emitter layer 18 are injected through the P-type channel layer 20 into the N-type substrate 26 (which functions as a drift layer), and holes from the P-type collector layer 30 are injected into the N-type substrate 26. As a result, a conductivity modulation effect occurs in the N-type substrate 26, the resistance is greatly reduced, and large currents may flow. At this time, the buffer layer 28 functions to stop a depletion layer from widening in the N-type substrate 26.

An object with the semiconductor device 10 according to the present exemplary embodiment is to assuredly achieve the removal of undesired impurities, which are not shown in the drawings, that adhere to the N-type substrate 26 in association with etching of the N-type substrate 26, and to enable precise design of a density profile of impurities in the P-type collector layer 30.

Herebelow, a fabrication method of the semiconductor device in accordance with the present exemplary embodiment is described using FIG. 4 and FIG. 5A to FIG. 5D.

Figure 4:
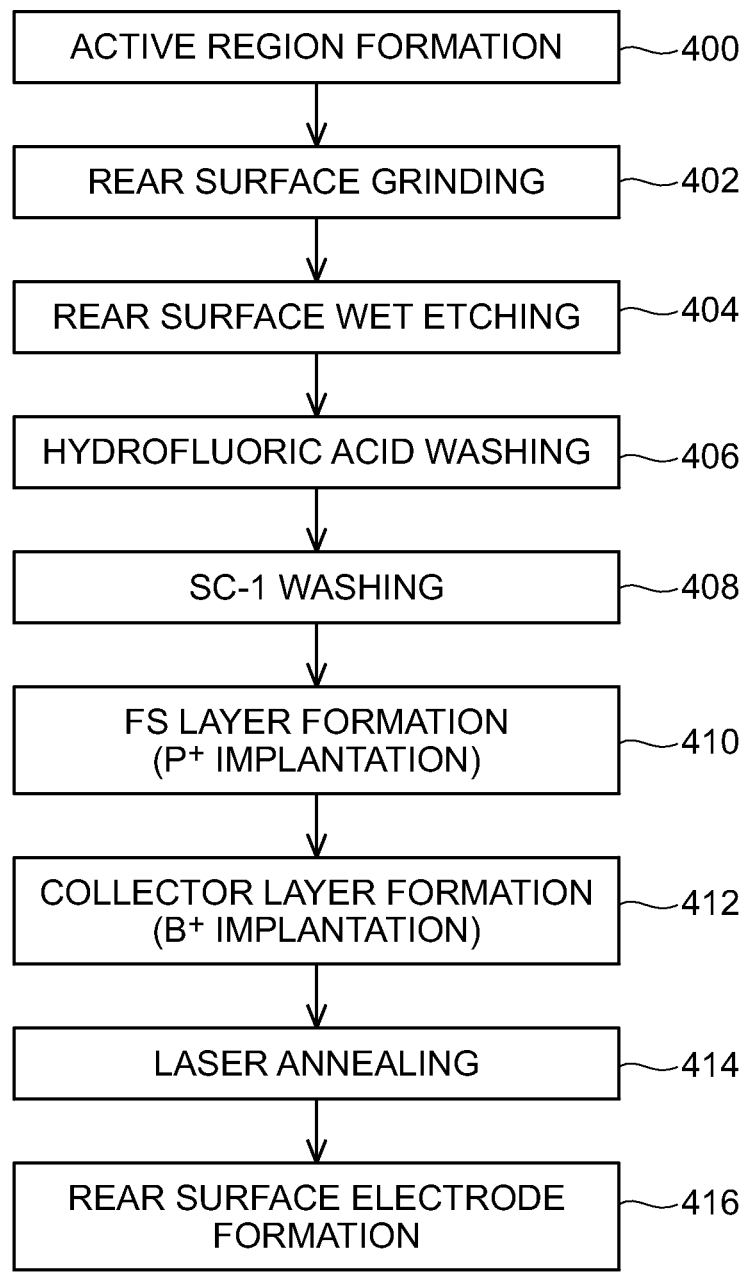
FIG. 4 is a flowchart for describing an example of steps in the fabrication of a semiconductor device in accordance with the exemplary embodiment.

First, in step 400 of FIG. 4, the above-described active region is formed at the front surface of the silicon substrate.

Next, in step 402, mechanical grinding is applied to the rear surface of the silicon substrate. This grinding may be carried out using, for example, an infeed grinder.

Then, in step 404, after the grinding, wet etching is applied to the rear surface of the silicon substrate. Here, an etching chemical solution that is employed may be, for example, a mixed chemical solution including hydrofluoric acid, nitric acid and sulfuric acid. The functions of the acids in this mixed chemical solution are as described above.

Then, in step 406, the rear surface of the silicon substrate that has been subjected to the wet etching is washed with hydrofluoric acid.

Figure 5A:
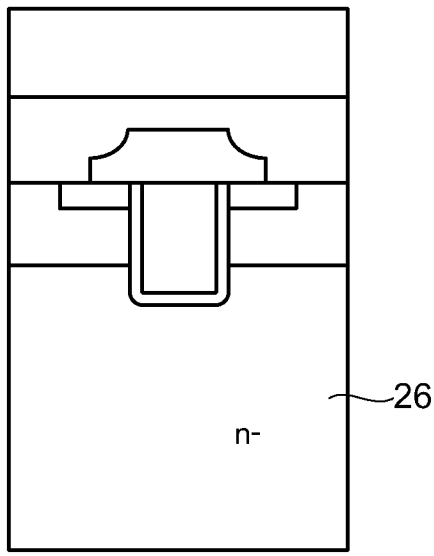
FIG. 5A, FIG. 5B, FIG. 5C and FIG. 5D are vertical sectional diagrams supporting the description of the example of steps in the fabrication of the semiconductor device in accordance with the exemplary embodiment.

In step 408, SC-1 washing is applied to the rear surface of the silicon substrate. A cross-section of the substrate at this time is shown in FIG. 5A.

The term "SC-1 washing" used herein is intended to include washing with washing solutions containing aqueous ammonia and aqueous hydrogen peroxide, by a washing method in which a surface of a silicon substrate is first oxidized by aqueous hydrogen peroxide, after which the silicon oxide is etched with the alkaline ammonia, and various particles adhering to the silicon oxide are removed by lift-off.

The washing with hydrofluoric acid in step 406 and the SC-1 washing in step 408 are steps that remove phosphorus contamination associated with the wet etching. The washing with hydrofluoric acid and SC-1 washing are both "light etching", in which the etching rate is restricted. Thus, the flatness of the rear surface of the silicon substrate provided by the wet etching of step 404 is maintained even while phosphorus adhering to the rear surface of the silicon substrate is removed.

It should be noted that an effect can be obtained even with only one or other of the washing with hydrofluoric acid and the SC-1 washing. Thus, performing both is not necessarily required; just one may be performed, depending on the density of residual phosphorus that can be tolerated. Moreover, the washing with hydrofluoric acid and the SC-1 washing do not necessarily need to be carried out in this order. The washing with hydrofluoric acid may be carried out after the SC-1 washing.

Figure 5B:
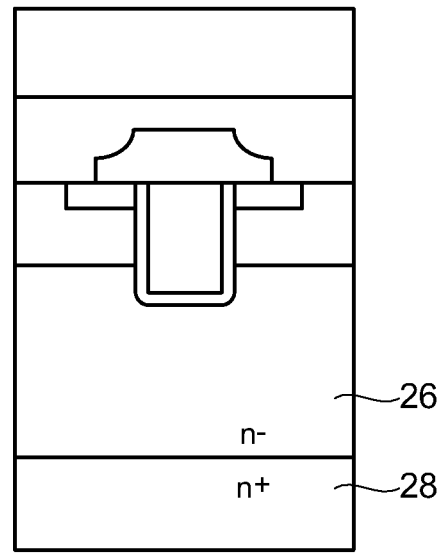

Then, in step 410, after the SC-1 washing, phosphorus ions ($31P^+$) are implanted into the rear surface of the silicon substrate with an acceleration energy of several hundred keV to form the buffer layer (field stop layer) 28 (FIG. 5B). The buffer layer 28 is formed so as to have a peak of phosphorus density in the N-type substrate 26, that is, in general terms, so as to have a peak in the vicinity of the "$n^+$" label in FIG. 5B.

Figure 5C:
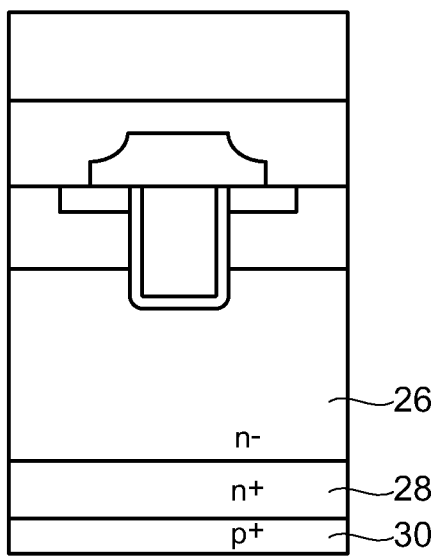

In step 412, boron ions ($11B^+$) are implanted into the rear surface of the silicon substrate with an acceleration energy of several tens of keV to form the P-type collector layer 30 (FIG. 5C).

In step 414, laser annealing is applied to the boron in order to activate the boron implanted in step 412.

Figure 5D:
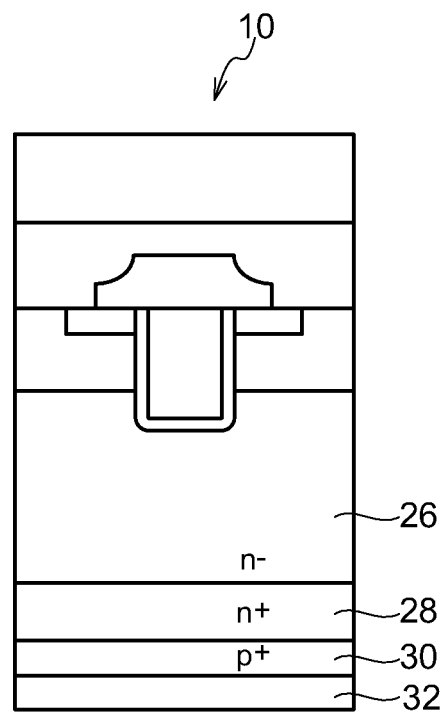

In step 416, the rear surface metal electrode 32 is formed at the rear surface of the silicon substrate. Thus, the semiconductor device (IGBT) 10 according to the present exemplary embodiment is completed (FIG. 5D).

Thereafter, dicing and the like is performed and chips with appropriate numbers of the semiconductor device 10 are separated out.

Example 1

Four specimens were prepared using silicon substrates, laser annealing was performed, and phosphorus densities were evaluated by SIMS analysis. The thickness after rear surface grinding of the silicon substrates used for the evaluations was approximately 100 μm.

Specimen 1: After rear surface grinding, conventional wet etching was performed on the silicon substrate (i.e., step 404 of the fabrication steps in FIG. 4 was carried out). The silicon etching chemical solution was a mixed chemical solution of 10% hydrofluoric acid, 30% nitric acid, 20% sulfuric acid, 20% phosphoric acid and 20% water (proportions by volume), and the etching rate was approximately 20 μm/minute. The etching duration was 1 minute, grinding the silicon substrate to approximately 80 μm. After the wet etching, a duration of washing with purified water was about 60 seconds.

Specimen 2: After the conventional wet etching described above, the silicon substrate was rinse-washed with purified water for 120 seconds (i.e., the purified water rinse-washing was applied for twice the conventional duration).

Specimen 3: After the conventional wet etching described above, the silicon substrate was washed with hydrofluoric acid (0.3%). The etching rate of this oxide layer etching with hydrofluoric acid was approximately 0.002 μm/minute, and the etching duration was 1 minute.

Specimen 4: After the conventional wet etching described above, washing with hydrofluoric acid (0.3%) and SC-1 washing were applied to the silicon substrate. The mixing ratio of the chemical solution of the SC-1 washing was 1 part ammonia (NH$_4$OH) to 1 part aqueous hydrogen peroxide (H$_2$O$_2$) to 10 parts water (H$_2$O) (proportions by volume). The rate of etching of the silicon was approximately 0.5 nm/minute and the etching duration was 1 minute. The etching rate and etching duration of the oxide layer etching with hydrofluoric acid (0.3%) were the same as for specimen 3.

Figure 6:
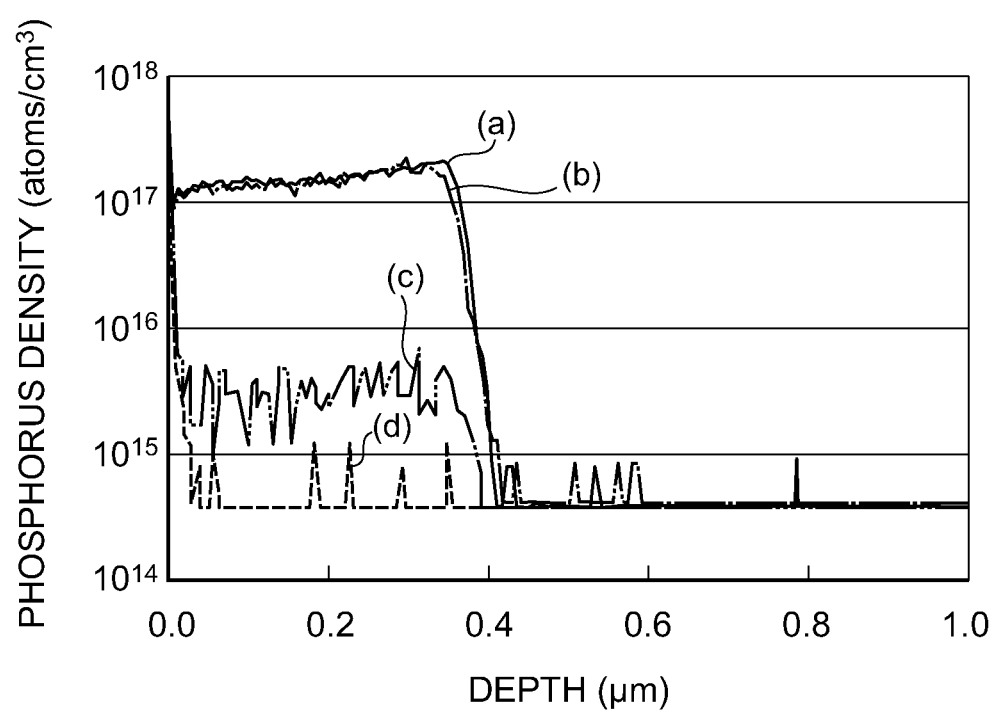
FIG. 6 is a graph showing densities of phosphorus in a semiconductor device according to an Example 1.

The results of SIMS analysis of these four specimens are shown in FIG. 6. FIG. 6 shows phosphorus densities, with (a) corresponding to specimen 1, (b) corresponding to specimen 2, (c) corresponding to specimen 3 and (d) corresponding to specimen 4.

In specimen 1 produced by the conventional wet etching, shown as (a) in FIG. 6, phosphorus is present in densities of the order of $10^{17}$ atoms/cm$^3$ to a depth of 0.4 µm from the etched surface.

In specimen 2, with twice the duration of rinse-washing with purified water after the wet etching, shown as (b) in FIG. 6, it is apparent that the phosphorus density is a little lower than in specimen 1 but there is no great difference. Therefore, it is likely that phosphorus cannot be thoroughly removed just by rinse-washing with purified water.

In specimen 3 for which washing with hydrofluoric acid is added, shown as (c) in FIG. 6, it is apparent that the phosphorus is greatly reduced, with phosphorus densities of the order of $10^{15}$ atoms/cm$^3$. Thus, an effect of residual phosphorus being removed by hydrofluoric acid is verified. However, complete removal of the phosphorus is not achieved.

In specimen 4 for which both washing with hydrofluoric acid and SC-1 washing are applied, shown as (d) in FIG. 6, the phosphorus density measurements are of the order of $10^{14}$ atoms/cm$^3$, which is the lower limit of phosphorus detection of the SIMS. Thus, it is seen that phosphorus is substantially completely removed.

From the evaluation results described above, it can be seen that, if washing with hydrofluoric acid and SC-1 washing are carried out after wet etching with a chemical solution containing phosphorus, residual phosphorus can be substantially completely removed. It can also be seen that substantial amounts of the residual phosphorus can be removed if one or other of the washing with hydrofluoric acid and the SC-1 washing is carried out.

Example 2

A sample of a practical IGBT was prepared and impurity densities therein were measured.

Grinding was applied to the rear surface of a silicon substrate at whose front surface an active region for regulating current flowing in the thickness direction of the substrate had been formed, and the processing according to the above-described specimen 4 was carried out; that is, washing with hydrofluoric acid and SC-1 washing were carried out after usual wet etching. Conditions such as the thickness of the silicon substrate, the etching chemical solutions, the etching rates, the etching durations and so forth were the same as for specimen 4.

At the silicon substrate for which the processing according to specimen 4 had been completed, phosphorus ions (31P$^+$) were implanted into the rear surface with an acceleration energy of 600 keV to form the buffer layer (field stop layer) 28 (step 410 in FIG. 4). The thickness of the buffer layer 28 was approximately 1.5 µm.

Then, boron ions (11B$^+$) were implanted into the rear surface of the silicon substrate with an acceleration energy of 30 keV to form the P-type collector layer 30 (step 412 in FIG. 4). The thickness of the P-type collector layer 30 was approximately 0.2 µm. Thereafter, laser annealing was applied to the implanted boron (step 414 in FIG. 4).

Figure 7:
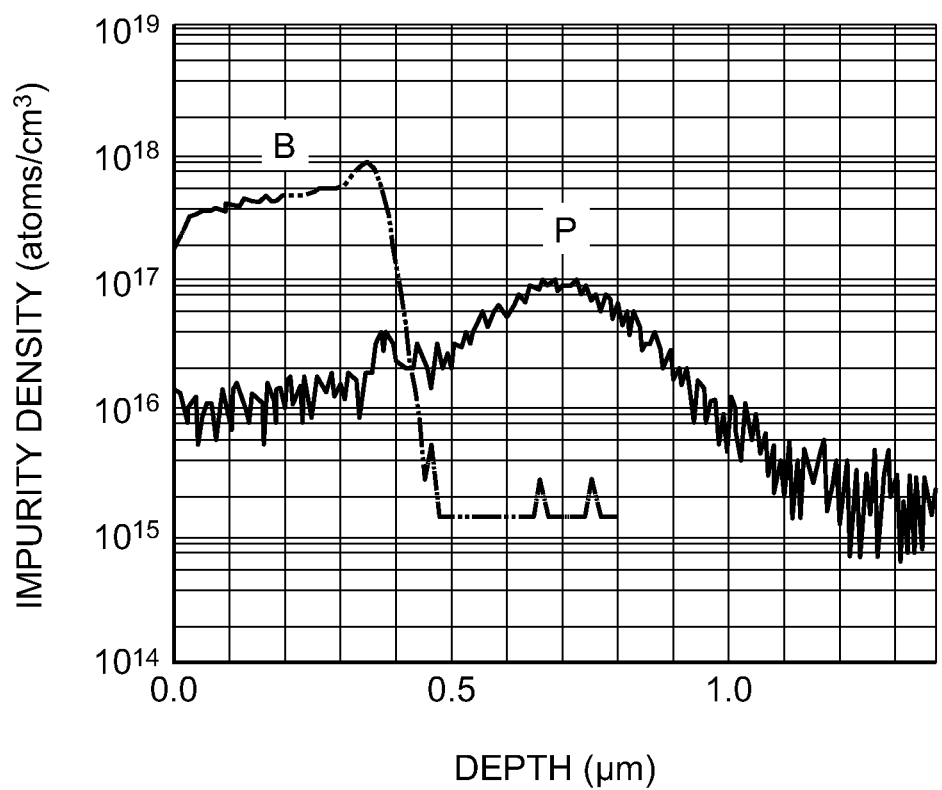
FIG. 7 is a graph showing densities of impurities in a semiconductor device according to an Example 2.

The results of SIMS analysis of the sample obtained in this manner are shown in FIG. 7.

As can be seen in FIG. 7, the phosphorus density of this sample (the graph marked "P" in FIG. 7) shows a distribution close to a normal distribution with a peak value of approximately $1 \times 10^{17}$ atoms/cm$^3$ at a depth of approximately 0.7 µm, which is substantially in accordance with targets. Thus, the effect of phosphorus being removed by the washing with hydrofluoric acid and the SC-1 washing is verified. The phosphorus density in the thickness range of the P-type collector layer 30 (approximately 0.4 µm) shows values in the vicinity of $1 \times 10^{16}$ atoms/cm$^3$ to $2 \times 10^{16}$ atoms/cm$^3$. Thus, it can be seen that the phosphorus density values are suppressed to around ⅕ of the peak value of $1 \times 10^{17}$ atoms/cm$^3$ in the buffer layer 28.

According to the results of Example 1, specimen 1, in which only conventional wet etching was carried out and neither washing with hydrofluoric acid nor SC-1 washing was applied, included around $2 \times 10^{17}$ atoms/cm$^3$ of phosphorus to a depth of approximately 0.4 µm from the wet-etched rear surface. This density corresponds to 40% of a P-type collector impurity density of $5 \times 10^{17}$ atoms/cm$^3$, which is the target for next-generation IGBTs. Residues of phosphorus in such large amounts lead to variations in the impurity densities of the P-type collectors of IGBTs, and are a factor in, for example, large variations in the value of $E_{off}$.

In the present sample, as illustrated in FIG. 7, the density of boron in the P-type collector layer 30 (the graph marked "B" in FIG. 7) is around $3 \times 10^{17}$ atoms/cm$^3$. Therefore, the density of phosphorus in the P-type collector layer 30 is about ⅒ of the density of the P-type impurity, boron, in the P-type collector. Thus, because there is an order of magnitude of difference, the effect of phosphorus in the P-type collector layer 30 on the P-type impurities (boron) in the P-type collector layer is small, and precise design of impurity densities in the P-type collector layer 30 is possible.

As is made clear in the descriptions above, according to the semiconductor device 10 in accordance with the present exemplary embodiment, a semiconductor device fabrication method may be provided that assuredly removes undesired impurities that adhere to a semiconductor substrate in association with etching of the semiconductor substrate and that enables precise design of an impurity density profile of the semiconductor substrate, and a semiconductor device that is fabricated by this fabrication method may be provided.

Note that, while it is desirable to implement the removal of phosphorus by washing with hydrofluoric acid and SC-1 washing after wet etching of the rear surface of the silicon substrate, the removal of phosphorus may be carried out before laser annealing, and may be carried out at both stages.

In the exemplary embodiment described above, boron is described as an example of a P-type impurity in the P-type collector, but this is not limiting. Other P-type impurities such as gallium (Ga) and the like may be used.

What is claimed is:

1. A method of fabricating a semiconductor device, the method comprising:
  forming a first semiconductor region at a front surface of a substrate, the first semiconductor region including an active element that regulates current flowing in a thickness direction of the substrate;
  grinding a rear surface of the substrate;
  after the grinding, performing a first etching that etches the rear surface of the substrate with a chemical solution including phosphorus;

after the first etching, performing a second etching that etches the rear surface with an etching method with a lower etching rate than the first etching; and after the second etching, forming a second semiconductor region through which the current is to flow, by implanting impurities from the rear surface of the substrate.

2. The method according to claim 1, wherein the chemical solution of the first etching is a mixed solution including hydrofluoric acid, nitric acid and phosphoric acid.

3. The method according to claim 1, wherein the second etching includes at least one of washing with hydrofluoric acid and SC-1 washing.

4. The method according to claim 1, further comprising activating the impurities implanted from the rear surface of the substrate.

5. The method according to claim 4, wherein the activating includes activation by laser annealing.

6. The method according to claim 1, further comprising forming a rear surface electrode on the second semiconductor region.

* * * * *